(12) United States Patent
Kinyua et al.

(10) Patent No.: US 11,870,453 B2
(45) Date of Patent: Jan. 9, 2024

(54) CIRCUITS AND METHODS FOR A NOISE SHAPING ANALOG TO DIGITAL CONVERTER

(71) Applicant: Taiwan Semiconductor Manufacturing Company, Ltd., Hsinchu (TW)

(72) Inventors: Martin Kinyua, Cedar Park, TX (US); Eric Soenen, Cedar Park, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 44 days.

(21) Appl. No.: 17/718,467

(22) Filed: Apr. 12, 2022

(65) Prior Publication Data

US 2023/0179214 A1 Jun. 8, 2023

Related U.S. Application Data

(60) Provisional application No. 63/281,790, filed on Nov. 22, 2021.

(51) Int. Cl.
*H03M 1/08* (2006.01)
(52) U.S. Cl.
CPC ................................ *H03M 1/0854* (2013.01)
(58) Field of Classification Search
CPC ........................... H03M 1/08; H03M 1/0854
See application file for complete search history.

(56) References Cited

U.S. PATENT DOCUMENTS

| | | | | |
|---|---|---|---|---|
| 6,563,448 B1 * | 5/2003 | Fontaine | ............ | H03H 17/0642 |
| | | | | 341/143 |
| 7,538,704 B2 * | 5/2009 | Dent | ....................... | H03M 3/41 |
| | | | | 341/143 |

(Continued)

OTHER PUBLICATIONS

Straayer, Matthew, Perrott, Michael; A 12-Bit, 10-MHz Bandwidth, Continuous-Time ΣΔ ADC With a 5-Bit, 950-MS/s VCO-Based Quantizer; IEEE Journal of Solid-State Circuits, 43(4); pp. 805-814; Apr. 2008.

*Primary Examiner* — Lam T Mai
(74) *Attorney, Agent, or Firm* — Jones Day

(57) ABSTRACT

Systems and methods are provided for analog-to-digital conversion (ADC). A first quantization stage may be configured to receive an analog input signal and sample the analog input signal to generate a first digital signal, the first quantization stage may be further configured to filter the first digital signal with a first noise-shaping transfer function to generate a first noise-shaped digital output and to generate a quantization error signal based on a comparison of the analog input signal and the first noise-shaped digital output. A voltage controlled oscillator (VCO)-based second quantization stage may be configured to receive the quantization error signal and sample the quantization error signal to generate a second digital signal, the VCO-based second quantization stage may be further configured to filter the second digital signal with a second noise-shaping transfer function to generate a second noise-shaped digital output. A first digital filter may be configured to filter the first noise-shaped digital output with an equivalent signal transfer function of the VCO-based second quantization stage to generate a first stage digital output. A second digital filter may be configured to filter the second noise-shaped digital output with the first noise-shaping transfer function to generate a second stage digital output with second order (Continued)

noise-shaping characteristics A combination circuit may combine the first stage digital output and the second stage digital output to generate a digital ADC output signal with second order noise shaping characteristics.

20 Claims, 6 Drawing Sheets

(56) References Cited

U.S. PATENT DOCUMENTS

| | | | | |
|---|---|---|---|---|
| 8,400,341 B2* | 3/2013 | Su | ............... | H03M 1/1265 341/157 |
| 8,810,443 B2* | 8/2014 | Steensgaard-Madsen | | H03M 1/0668 341/172 |
| 9,503,112 B1* | 11/2016 | Zanbaghi | ............ | H03M 1/0602 |
| 10,181,860 B1* | 1/2019 | Patil | ............... | H03M 1/145 |
| 10,931,299 B1* | 2/2021 | Kinyua | ............... | H03K 3/0315 |
| 11,196,434 B1* | 12/2021 | Sun | ............... | H03M 1/0626 |
| 11,424,724 B2* | 8/2022 | Kinyua | ............... | H03M 3/432 |
| 2010/0056201 A1* | 3/2010 | Akamine | ............. | H04B 1/0017 375/220 |
| 2011/0006844 A1* | 1/2011 | Soenen | ............... | H03F 3/2173 330/251 |
| 2011/0199246 A1* | 8/2011 | Kinyua | ............... | H03M 3/50 341/143 |
| 2012/0242521 A1* | 9/2012 | Kinyua | ............... | H03M 7/3022 341/143 |
| 2014/0062747 A1* | 3/2014 | Kinyua | ............... | H03M 3/504 341/150 |
| 2015/0171886 A1* | 6/2015 | Kinyua | ............... | H03M 1/747 341/150 |
| 2015/0229323 A1* | 8/2015 | Kinyua | ............... | H03H 11/04 327/552 |

* cited by examiner

CIRCUITS AND METHODS FOR A NOISE SHAPING ANALOG TO DIGITAL CONVERTER

CROSS-REFERENCE TO RELATED APPLICATIONS

This application claims priority to U.S. Provisional Application No. 63/281,790, filed Nov. 22, 2021, which is incorporated herein by reference in its entirety.

TECHNICAL FIELD

The technology described in this patent document relates generally to analog to digital converters.

BACKGROUND

An analog-to-digital converter (ADC) is usable to convert analog signals to digital signals. An ADC structure typically includes one or more quantizers, which map a continuous analog signal to discrete digital representations using a quantization process such as rounding or truncation. The quantization process typically introduces an error, commonly referred to as quantization error, that results from mapping a continuous input signal to a finite set of discrete quantization levels. Voltage controlled oscillator (VCO)-based quantizers are known to reduce quantization error because a VCO has inherent first order noise shaping of its quantization error. A VCO, however, typically suffers from voltage-to-frequency tuning curve (i.e., VCO tuning gain) non-linearity, which may limit the signal-to-(noise+distortion) ratio (SNDR) of a typical VCO-based quantizer.

BRIEF DESCRIPTION OF THE DRAWINGS

Aspects of the present disclosure are best understood from the following detailed description when read with the accompanying figures.

DETAILED DESCRIPTION

Figure 1:
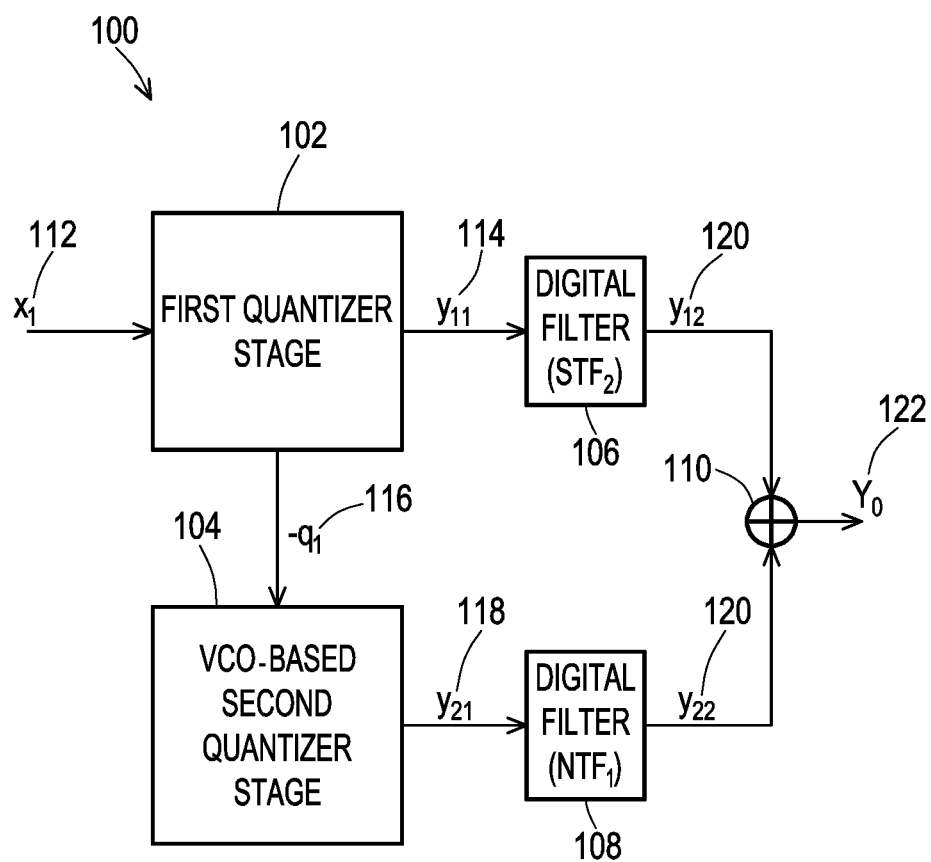
FIG. 1 is a block diagram of an example analog-to-digital conversion circuit in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

FIG. 1 is a block diagram of an example analog-to-digital conversion (ADC) circuit 100 with second order noise shaping in accordance with embodiments. The example ADC circuit 100 includes a first quantization stage 102, a second quantization stage 104, a first digital filter 106, a second digital filter 108, and a combination circuit 110.

The first quantization stage 102 is configured to receive an analog input signal ($X_1$) 112, sample the analog input signal 112 to generate a digital signal, and filter the digital signal with a first noise-shaping transfer function ($NTF_1$) to generate a first noise-shaped digital output ($y_{11}$) 114. The first quantization stage 102 is further configured to generate a quantization error signal ($q_1$) based, at least in part, on a comparison of the analog input signal 112 and the digital output 114. In embodiments, the first quantization stage 102 may include a successive approximation register (SAR) quantizer that utilizes the quantization error signal ($q_1$) in a feedback loop to the analog input signal 112, for example as described below with reference to the example shown in FIG. 2. A SAR-based first quantization stage may, for example, determine the quantization error signal ($q_1$) based on a residue voltage produced by the SAR quantizer during generation of the first noise-shaped digital output, and may shape the quantization error signal ($q_1$) using a loop filter to achieve predetermined noise-shaping characteristics having a noise-shaping transfer function ($NTF_1$).

The second quantization stage 104 may be a voltage controlled oscillator (VCO)-based quantization stage that is configured to receive an inversion of the quantization error signal ($-q_1$) 116 and sample the inverted quantization error signal ($-q_1$) to generate a second digital signal. The VCO-based second quantization stage 104 may be further configured to filter the second digital signal with a second noise-shaping transfer function ($NTF_2$) to generate a second noise-shaped digital output ($y_{21}$) 118. In embodiments, the VCO-based quantization stage 104 may include an open-loop quantizer configuration (i.e., without a feedback loop) in which the noise-shaping transfer function ($NTF_2$) approximates a first-order difference operation, for example as described below with reference to the example shown in FIG. 2.

The first digital filter 106 is configured to filter the first noise-shaped digital output ($y_{11}$) 114 with a signal transfer function ($STF_2$) of the second quantization stage 104 in order to match the filtering function seen by the first stage quantization error contained in both $y_{21}$ and $y_{22}$ paths. The second digital filter 108 is configured to filter the second noise-shaped digital output $y_{(21)}$ 118 with the noise-shaping transfer function ($NTF_1$) of the first quantization stage 102 to generate a second stage digital output ($y_{22}$) 120 with second order noise-shaping characteristics. The combination circuit 110 in the illustrated embodiment is an adder circuit that combines the first stage digital output ($y_{12}$) 120 and the second stage digital output ($y_{22}$) to generate a digital ADC output signal ($Y_O$) 122 with second order noise shaping characteristics. In other embodiments, the combination circuit 110 may, for example, be a difference circuit and the quantization signal input 116 to the second quantization stage 104 may be non-inverted.

Figure 2:
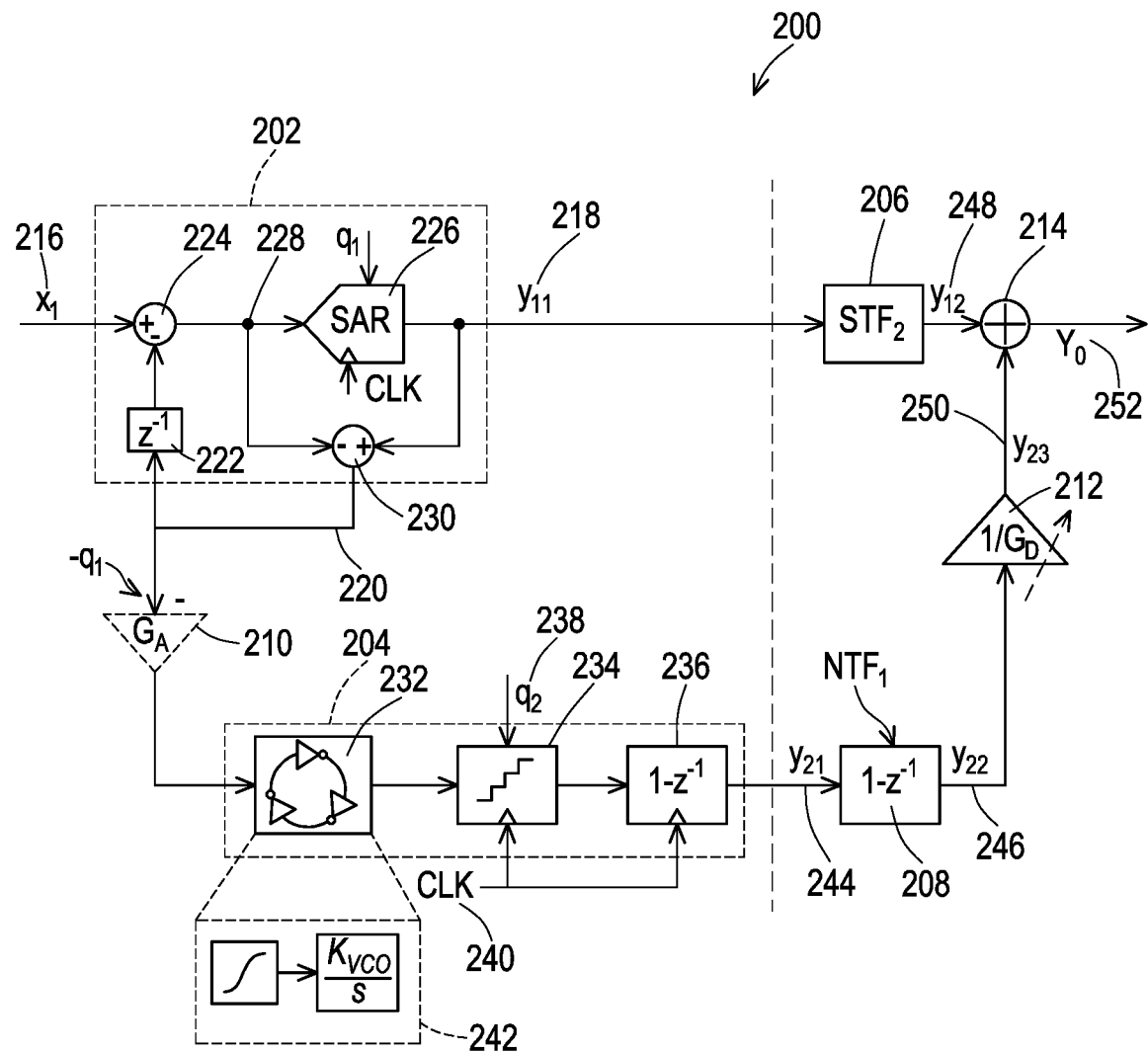
FIG. 2 is a signal flow diagram of an example embodiment of an analog-to-digital circuit in accordance with embodiments.

FIG. 2 is a signal flow diagram of an example embodiment of an analog-to-digital conversion (ADC) circuit 200 in accordance with embodiments. The example ADC circuit 200 includes a noise-shaping SAR quantization stage 202, an open-loop noise-shaping VCO-based quantization stage 204, a first digital filter 206, a second digital filter 208, a pair of amplifiers 210, 212, and a combination circuit 214.

The noise-shaping SAR quantization stage 202 receives an analog input signal ($X_1$) 216, samples the analog input signal 216 to generate a digital signal, and filters the digital signal with a first noise-shaping transfer function ($NTF_1$) to generate a first noise-shaped digital output ($y_{11}$) 218. The noise-shaping SAR quantization stage 202 is further configured to generate a quantization error signal ($q_1$) 220 based, at least in part, on a comparison of the analog input 228 and the digital output 218. The quantization error signal ($q_1$) 220 is delayed by one clock cycle ($z^{-1}$) by delay block 222 and is fed back to the analog input via combination block 224.

Figure 5A:
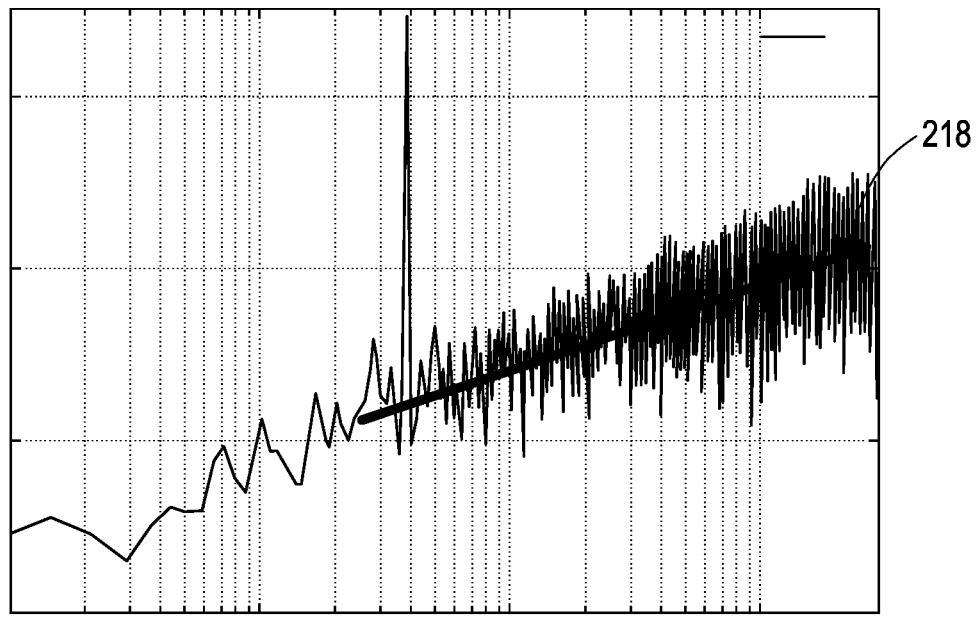
FIGS. 5A-5C are signal diagrams showing an example frequency-domain operation of the analog-to-digital circuit shown in FIG. 2.

The noise-shaping transfer function ($NTF_1$) of the SAR quantization stage 202 may be represented by the Z-domain expression ($1-z^{-1}$). The noise-shaped digital output ($y_{11}$) 218 may then be represented by the equation, $y_{11}=X_1+q_1(1-z^{-1})$. An example spectrum of the noise-shaped digital output ($y_{11}$) 218 is illustrated in the frequency-domain signal diagram shown in FIG. 5A. As illustrated in FIG. 5A, the noise-shaped digital output ($y_{11}$) 218 does not include harmonic distortion, which is typical for a SAR quantization stage 202 having linear noise shaping.

The SAR quantization stage 202 may, for example, be implemented using a known SAR architecture that includes switched capacitors, digital logic, and comparators, that are configured to high pass filter the comparator noise and quantization error, thereby diminishing the noise in the low frequency band of interest. In embodiments, the SAR quantization stage 202 may have a moderate resolution, such as a 6-bit digital output ($y_{11}$) 218. In one embodiment, the SAR quantization stage 202 may, for example, be implemented using the SAR architecture described in U.S. patent application Ser. No. 17/020,219, titled "Method and Circuit for Noise Shaping SAR Analog-to-Digital Converter," the entirety of which is incorporated herein by reference. In the illustrated signal flow diagram 200, the SAR quantization is depicted by SAR block 226 and the quantization error ($q_1$) that is inherent to the SAR quantization process is depicted as an input to block 226 (i.e., quantization error ($q_1$) is not an actual physical input to quantization block 226). In addition, the illustrated signal flow diagram 200 depicts the comparison of the analog input 228 and the digital output 216 to generate quantization error signal ($q_1$) 220 using comparison block 230. It should be understood, however, that in a SAR architecture the quantization error ($q_1$) is available at the end of the conversion cycle, i.e., the quantization error signal ($q_1$) 220 may be determined based on a residue voltage produced by the SAR quantizer 226 during generation of the noise-shaped digital output 218, and thus the quantization error signal ($q_1$) 220 may be generated without the need for additional hardware (such as a difference circuit.)

An inverse of the quantization error signal ($q_1$) 220 may be amplified by amplifier 210, which provides an analog inter-stage gain ($G_A$), and the amplified quantization error signal ($-q_1 \cdot G_A$) is input to the open-loop noise-shaping VCO-based quantization stage 204. The signal flow diagram of the open-loop noise-shaping VCO-based quantization stage 204 includes a voltage controlled oscillator (VCO) block 232, a quantizer block 234, and a first order difference block 236. The VCO block 232 may, for example, be implemented using a multi-phase ring oscillator that is frequency modulated using the amplified quantization error signal ($-q_1 \cdot G_A$) input as a tuning voltage. As depicted in the signal flow diagram at reference 242, the VCO 232 may be modelled as an integrator that converts the input signal from the voltage domain to the phase domain and has a non-linear voltage-to-frequency tuning curve, which can be expressed as the equation $$\frac{k_{vco}}{s},$$

where $k_{vco}$ is the VCO voltage-to-frequency tuning gain and "1/s" represents the Laplace transform of the integrator. The impact of VCO non-linearity is mitigated, however, because the amplified quantization error signal ($-q_1 \cdot G_A$) input is small and mostly random in nature.

The quantizer 234 provides a quantized estimate of the input amplified quantization error signal ($-q_1 \cdot G_A$), for example by using a set of registers to count the number of oscillator edges generated by the VCO block 232 within each period of an input clock signal (CLK) 240. In the illustrated signal flow diagram 200, the quantizer 234 is modelled as a sampler that adds quantization error ($q_2$) 238. It should be understood that quantization error ($q_2$) 238 is an inherent property of the quantizer 234, although depicted as an input to the quantizer 234 for illustrative purposes (i.e., the quantization error ($q_2$) 238 is not an actual physical input to the quantizer 234).

The first order difference block 236 may, for example, include a logic circuit that filters the output of the quantizer 234 with a noise-shaping transfer function ($NTF_2$) to generate a second noise-shaped digital output ($y_{21}$). The second noise-shaping transfer function ($NTF_2$) may be expressed as ($1-z^{-1}$), and the noise-shaped digital output ($y_{21}$) 244 from the VCO-based quantization stage 204 may be expressed as the equation, $y_{21}=-q_1 \cdot G_A \cdot 2NT_{clk} k_{VCO} \cdot z^{-1}+(1-z^{-1})q_2$, where $q_1$ is the quantization error of the SAR quantization stage 202, $G_A$ is the gain applied by amplifier 210, N is the number of phases in the ring VCO 232, $T_{clk}$ is the sampling clock (CLK) 240 time period, $k_{VCO}$ is the VCO voltage-to-frequency tuning gain, and $q_2$ is the quantization error of the VCO-based quantization stage 204.

Figure 5B:
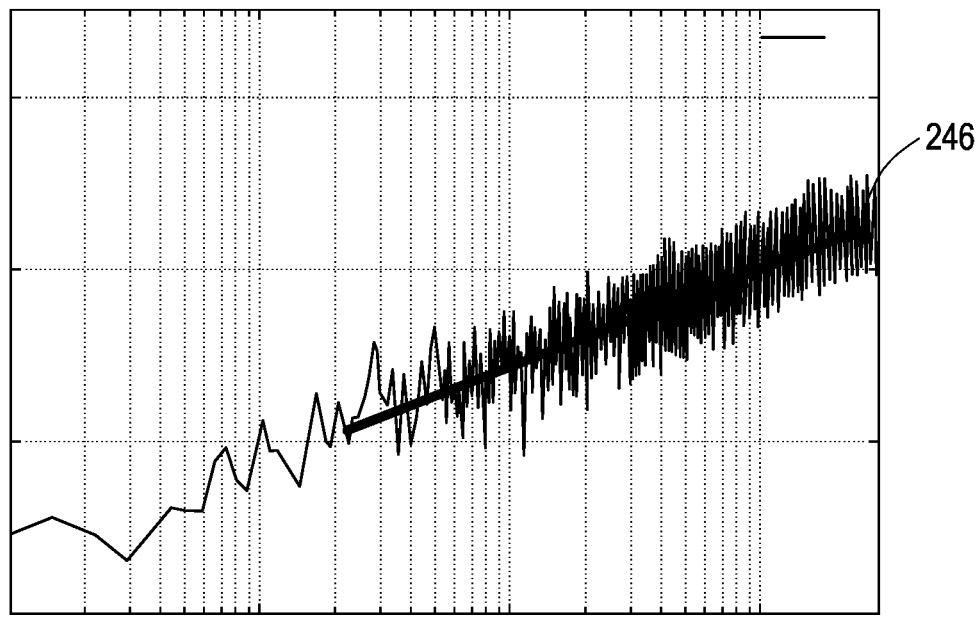

The noise-shaped digital output ($y_{21}$) 244 from the VCO-based quantization stage 204 is filtered by the second digital filter 208 with the noise-shaping transfer function ($NTF_1$) of the SAR quantization stage 202 to generate a second stage digital output ($y_{22}$) 246 with second order noise-shaping characteristics. The second stage digital output ($y_{22}$) 246 may thus be expressed as the equation, $y_{22}=-q_1 \cdot G_A \cdot 2NT_{clk} k_{VCO} \cdot z^{-1}(1-z^{-1})+(1-z^{-1})^2 q_2$. An example spectrum of the second state digital output ($y_{22}$) 246 is illustrated in the frequency-domain signal diagram shown in FIG. 5B. As illustrated in FIG. 5B, the second state digital output ($y_{22}$) 246 does not include harmonic distortion, which is because the input to the VCO-based quantization stage 204 is the quantization error ($q_1$) from the SAR-based quantization stage 202 (and not the analog input signal ($X_1$)). The skilled artisan will recognize that the lack of harmonic distortion in the output of the VCO-based quantization stage 204 is advantageous because a VCO-based quantizer often produces harmonic distortion.

In addition, the noise-shaped digital output ($y_{11}$) 218 from the SAR quantization stage 202 is filtered by the first digital filter 206 with a signal transfer function ($STF_2$) of the VCO-based quantization stage 204 in order match the filtering functions seen by the first stage quantization error ($q_1$)

as it traverses both $y_{21}$ and $y_{22}$ paths. The first stage digital output ($y_{12}$) 248 may be expressed as the equation, $y_{12}=STF_2[X_1+q_1(1-z^{-1})^2]$.

The second stage digital output ($y_{22}$) 246 is scaled by the amplifier 212, which may for example apply a digital gain of $1/G_D$, where $G_D=G_A$, such that the digital amplifier 212 removes the gain ($G_A$) applied to the input signal by the analog amplifier 210. The digital output ($y_{23}$) 250 of the digital amplifier 212 may thus be expressed by the equation $$y_{23} = -q_1 \cdot STF_2(1-z^{-1}) + (1-z^{-1})^2 \frac{q_2}{G_D},$$

where $STF_2 = 2NT_{clk}k_{VCO} \cdot z^{-1}$.

The combination circuit 214 in the illustrated embodiment is an adder circuit that combines the first stage digital output ($y_{12}$) 248 and the second stage digital output ($y_{23}$) 250 to generate a digital ADC output signal ($Y_0$) 252 with second order noise shaping characteristics. The digital ADC output signal ($Y_0$) 252 may be expressed by the equation, $$Y_0 = X_1 STF_2 + \frac{q_2}{G_D}(1-z^{-1})^2.$$

In other embodiments, the combination circuit 214 may, for example, be a subtraction circuit and the quantization signal input to the analog amplifier 210 may be non-inverted.

Figure 5C:
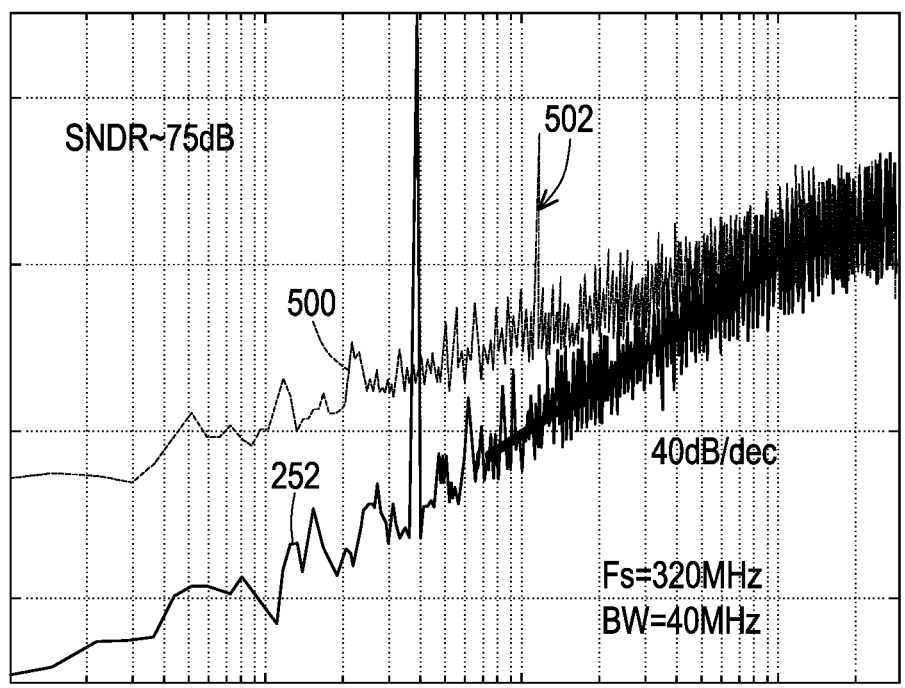

An example spectrum of the digital ADC output signal ($Y_0$) 252 is illustrated in the frequency-domain signal diagram shown in FIG. 5C. As illustrated in FIG. 5C, the digital ADC output signal ($Y_0$) 252 does not include harmonic distortion and has an increased slope compared to FIGS. 5A and 5B. For instance, in the embodiment illustrated in FIG. 5C, the digital ADC output signal ($Y_0$) 252 has a slope of 40 dB/dec and a SNDR of approximately 75 bB. Also illustrated in FIG. 5C is an example of an output signal 500 from a typical VCO-based ADC. As illustrated, the output from a typical VCO-based ADC includes harmonic distortion at reference 502, which is absent from the digital ADC output signal ($Y_0$) 252.

Figure 3:
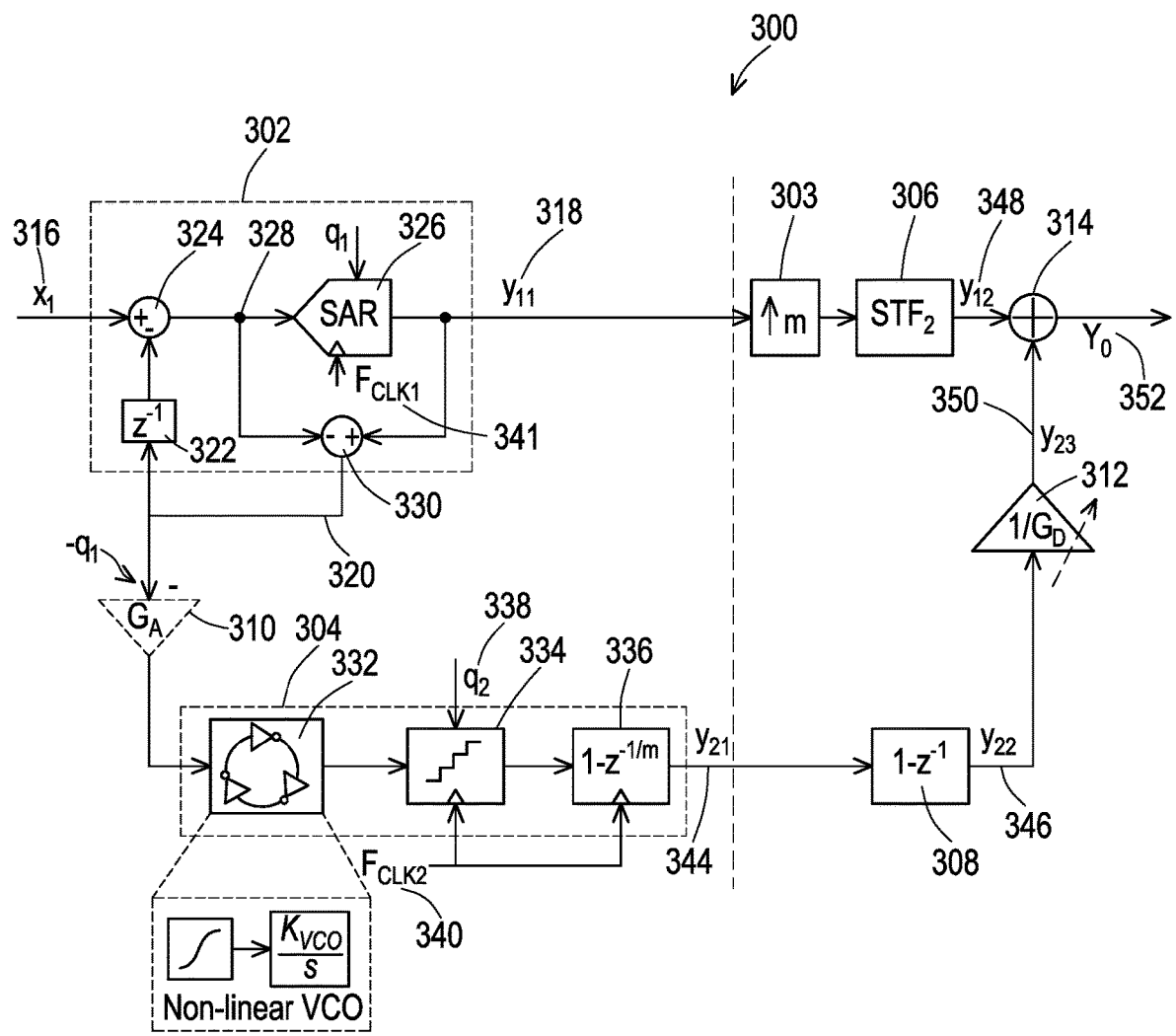
FIG. 3 is a signal flow diagram of another example embodiment of an analog-to-digital circuit in accordance with embodiments.

FIG. 3 is a signal flow diagram of another example embodiment of an analog-to-digital circuit 300 in accordance with embodiments. The example ADC circuit 300 includes a noise-shaping SAR quantization stage 302 with a digital up-sampler 303 at the output, an open-loop noise-shaping VCO-based quantization stage 304, a first digital filter 306, a second digital filter 308, a pair of amplifiers 310, 312, and a combination circuit 314.

The noise-shaping SAR quantization stage 302 receives an analog input signal ($X_1$) 316, samples the analog input signal 316 to generate a digital signal, and filters the digital signal with a first noise-shaping transfer function ($NTF_1$) to generate a first noise-shaped digital output ($y_{11}$) 318. The sampling rate of the noise-shaped output ($y_{11}$) 318 is then increased by a factor "m" with the digital up-sampler 303. The value of "m" may, for example, be selected as a ratio of the quantization clock signals ($F_{clk2}/F_{clk1}$), as detailed below. The noise-shaping SAR quantization stage 302 is further configured to generate a quantization error signal ($q_1$) 320 based, at least in part, on a comparison of the analog input 328 and the digital output 318. The quantization error signal ($q_1$) 320 is delayed by one clock cycle ($z^{-1}$) by delay block 322 and is fed back to the analog input via combination block 324.

The noise-shaping transfer function ($NTF_1$) of the SAR quantization stage 302 may be represented by the Z-domain expression $(1-z^{-1})$. The noise-shaped digital output ($y_{11}$) 318 may then be represented by the equation, $y_{11}=X_1+q_1(1-z^{-1})$.

The SAR quantization stage 302 may, for example, be implemented using a known SAR architecture that includes switched capacitors, digital logic, and comparators, that are configured to high pass filter the comparator noise and quantization error, thereby diminishing the noise in the low frequency band of interest. The SAR quantization stage 302 in this embodiment 300 may, for example, have a reduced resolution, such as a 4 or 5 bit digital output ($y_{11}$) 318 in order to enable a faster sampling rate.

In the illustrated signal flow diagram 300, the SAR quantization is depicted by SAR block 326 and the quantization error ($q_1$) that is inherent to the SAR quantization process is depicted as an input to block 326 (i.e., quantization error ($q_1$) is not an actual physical input to quantization block 326). In addition, the illustrated signal flow diagram 300 depicts the comparison of the analog input 328 and the digital output 316 to generate quantization error signal ($q_1$) 320 using comparison block 330. It should be understood, however, that in a SAR architecture the quantization error ($q_1$) is available at the end of the conversion cycle, i.e., the quantization error signal ($q_1$) 320 may be determined based on a residue voltage produced by the SAR quantizer 326 during generation of the noise-shaped digital output 318, and thus the quantization error signal ($q_1$) 320 may be generated without the need for additional hardware (such as a difference circuit.)

An inverse of the quantization error signal ($q_1$) 320 may be amplified by amplifier 310, which provides an analog inter-stage gain ($G_A$), and the amplified quantization error signal ($-q_1 \cdot G_A$) is input to the open-loop noise-shaping VCO-based quantization stage 304. The signal flow diagram of the open-loop noise-shaping VCO-based quantization stage 304 includes a voltage controlled oscillator (VCO) block 332, a quantizer block 334, and a first order difference block 336. The VCO block 332 may, for example, be implemented using a multi-phase ring oscillator that is frequency modulated using the amplified quantization error signal ($-q_1 \cdot G_A$) input as a tuning voltage.

The quantizer 334 provides a quantized estimate of the input amplified quantization error signal ($-q_1 \cdot G_A$), for example, by using a set of registers to count the number of oscillator edges generated by the VCO block 332 within each period of an input clock signal ($F_{CLK2}$) 340. In this embodiment 300, input clock signal ($F_{CLK2}$) 340 has a higher frequency than the input clock signal (Fclk1) 341 for the SAR quantization stage 302, causing the VCO-based quantization stage 304 to run at a higher sampling rate than the SAR quantization stage 302. This may, for example, take advantage of the ability to run the VCO-based quantization stage 304 at a faster rate due to its open-loop architecture and mainly digital operation.

In the illustrated signal flow diagram 300, the quantizer 334 is modelled as a sampler that adds quantization error ($q_2$) 338. It should be understood, however, that quantization error ($q_2$) 338 is an inherent property of the quantizer 334, although depicted as an input to the quantizer 334 for illustrative purposes (i.e., the quantization error ($q_2$) 338 is not an actual physical input to the quantizer 334).

The first order difference block 336 may, for example, include a logic circuit that filters the output of the quantizer 334 with a second a noise-shaping transfer function ($NTF_2$) to generate a second noise-shaped digital output ($y_{21}$). The second noise-shaping transfer function ($NTF_2$) in this embodiment 300 may be expressed as $(1-z^{-1/m})$, where m is the ratio ($F_{CLK2}/F_{CLK1}$) of the SAR and VCO input clocks 340, 341. The noise-shaped digital output ($y_{21}$) 344 from the VCO-based quantization stage 304 may therefore be expressed as the equation, $y_{21}=-q_1 \cdot G_A \cdot 2NT_{clk}k_{VCO} \cdot z^{-1}+(1-z^{-1/m})q_2$.

The noise-shaped digital output ($y_{21}$) 344 from the VCO-based quantization stage 304 is filtered by the second digital filter 308 with the noise-shaping transfer function ($NTF_1$) of the SAR quantization stage 302 to generate a second stage digital output ($y_{22}$) 346 with second order noise-shaping characteristics. The second stage digital output ($y_{22}$) 346 may thus be expressed as the equation, $y_{22}=-q_1 \cdot G_A \cdot 2NT_{clk}k_{VCO} \cdot z^{-1}(1-z^{-1})+(1-z^{-1})(1-z^{-1/m})q_2$. In addition, the up-sampled digital output from the SAR quantization stage 302 is filtered by the first digital filter 306 with a signal transfer function ($STF_2$) of the VCO-based quantization stage 304 in order match the filtering functions seen by the first stage quantization error ($q_1$) as it traverses both $y_{21}$ and $y_{22}$ paths such that the first stage quantization error will be cancelled and eliminated from the final output $Y_0$. The first stage digital output ($y_{12}$) 348 may be expressed as the equation, $y_{12}=STF_2[X_1+q_1(1-z^{-1})^2]$.

The second stage digital output ($y_{22}$) 346 is scaled by the amplifier 312, which may for example apply a digital gain of $1/G_D$, where $G_D=G_A$, such that the digital amplifier 312 removes the gain ($G_A$) applied to the input signal by the analog amplifier 310. The digital output ($y_{23}$) 350 of the digital amplifier 312 may thus be expressed by the equation, $$y_{23} = -q_1 \cdot STF_2(1-z^{-1}) + (1-z^{-1})(1-z^{-1/m})\frac{q_2}{G_D},$$

where $STF_2=2NT_{clk}k_{VCO} \cdot z^{-1}$.

The combination circuit 314 in the illustrated embodiment is an adder circuit that combines the first stage digital output ($y_{12}$) 348 and the second stage digital output ($y_{23}$) 350 to generate a digital ADC output signal ($Y_0$) 352 with second order noise shaping characteristics. The digital ADC output signal ($Y_0$) 352 may be expressed by the equation, $$Y_0 = X_1 STF_2 + \frac{q_2}{G_D}(1-z^{-1})(1-z^{-1/m}).$$

In other embodiments, the combination circuit 314 may, for example, be a subtraction circuit and the quantization signal input to the analog amplifier 310 may be non-inverted.

Figure 4:
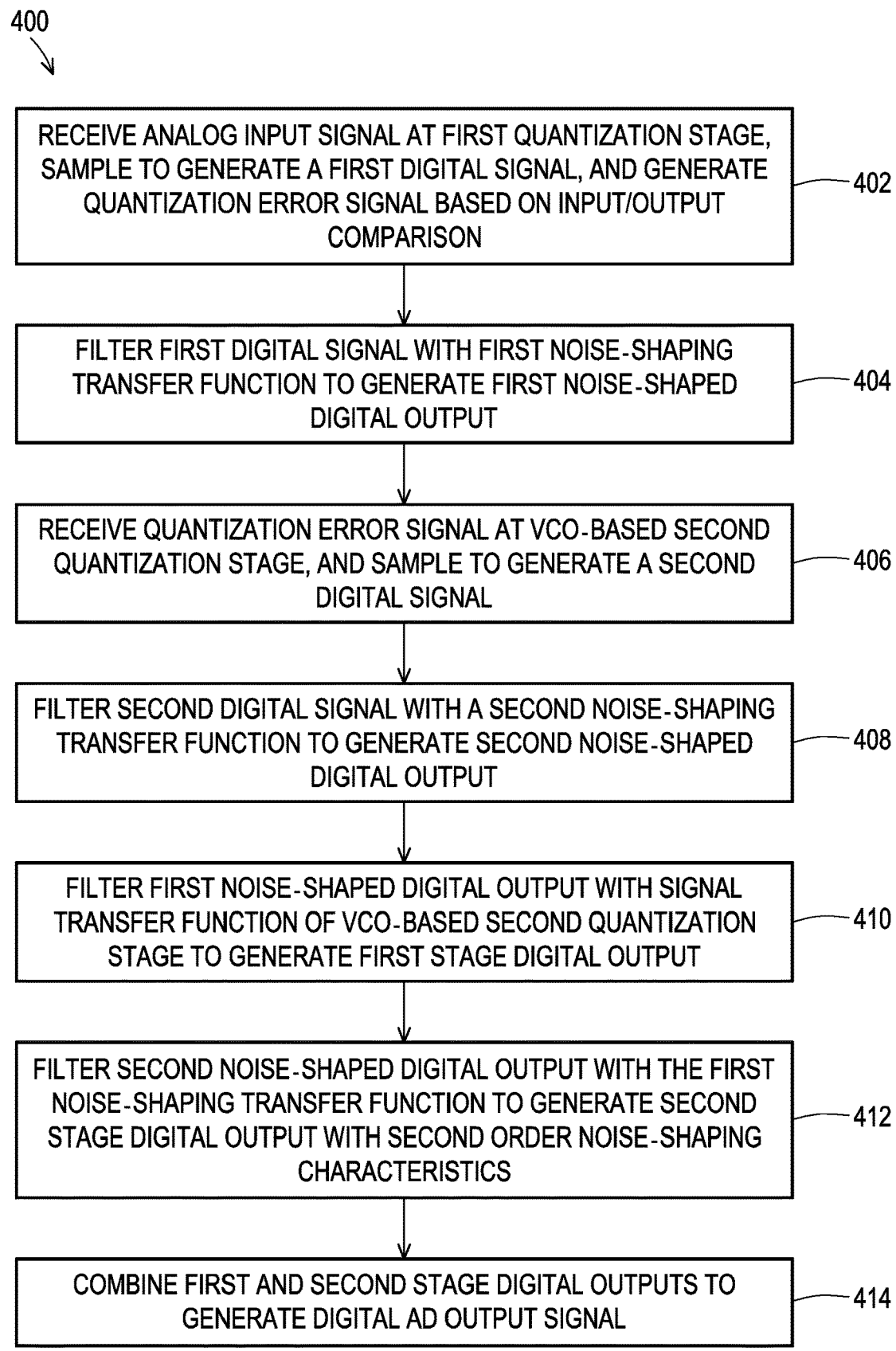
FIG. 4 is a flow diagram of an example analog-to-digital conversion method in accordance with embodiments.

FIG. 4 is a flow diagram of an example analog-to-digital conversion method 400 in accordance with embodiments. While systems for implementing the method of FIG. 4 may take a variety of forms, the method is described with reference to previous examples herein for ease of understanding. At 402, an analog input signal (112, 216, 316) is received at a first quantization stage (102, 202, 302), and the analog input signal is sampled to generate a first digital signal, and a quantization error signal (116, 220, 320) is generated based on a comparison of the analog input signal and the first noise-shaped digital output. At 404, the first digital signal is filtered with a first noise-shaping transfer function to generate a first noise-shaped digital output (114, 218, 318).

The quantization error signal (116, 220, 320) is received at a voltage controlled oscillator (VCO)-based second quantization stage (104, 204, 304) at 406, and the quantization error signal is sampled to generate a second digital signal. At 408, the second digital signal is filtered with a second noise-shaping transfer function to generate a second noise-shaped digital output (118, 244, 344).

At 410, the first noise-shaped digital output (114, 218, 318) is filtered (106, 206, 306) with an equivalent signal transfer function of the VCO-based second quantization stage (104, 204, 304) to enable the cancellation of the first stage quantization error from the final output $Y_0$ and generate a first stage digital output (120, 248, 348). At 412, the second noise-shaped digital output (118, 244, 344) is filtered (108, 208, 308) with the first noise-shaping transfer function to generate a second stage digital output (120, 246, 346) with second order noise-shaping characteristics. The first stage digital output (120, 248, 348) and the second stage digital output (120, 246, 346) are combined at 414 to generate a digital ADC output signal (122, 252, 352) with second order noise shaping characteristics.

The disclosed ADC circuit embodiments provide second order noise shaping, as detailed above. In addition, embodiments of the disclosure are amenable to implementation in deep nano-scale technology (e.g., N3, N2) at low core supply voltage. For example, embodiments of the disclosed SAR quantization stage work well at low supply voltage, and the disclosed VCO-based quantization stage processes the analog input in the time domain instead of the voltage domain, and thus may operate at low supply voltage in advance process technologies. In addition, embodiments of the disclosed ADC circuits allow for SAR decision errors to be absorbed by the VCO-based quantizer stage because the quantization error ($q_1$) from the SAR quantizer stage is not too large to cause VCO phase overflow. In embodiments, this may relax SAR comparator and DAC settling specifications, and eliminate a need for redundant capacitors and/or other correction techniques. In addition, embodiments of the disclosure may significantly mitigate the impact of VCO tuning gain non-linearity, which mitigates any harmonic distortion that would otherwise be present. Further, embodiments of the disclosed ADC circuits may operate in a pipelined fashion to increase conversion throughput because the VCO-based quantization stage does not need to be stopped between conversions.

Systems and methods as described herein may take a variety of forms. In one example, systems and methods are provided for an analog-to-digital conversion (ADC) circuit that includes a first quantization stage configured to receive an analog input signal and sample the analog input signal to generate a first digital signal, the first quantization stage further configured to filter the first digital signal with a first noise-shaping transfer function to generate a first noise-shaped digital output and to generate a quantization error signal based on a comparison of the analog input signal and the first noise-shaped digital output. A voltage controlled oscillator (VCO)-based second quantization stage is configured to receive the quantization error signal and sample the quantization error signal to generate a second digital signal, the VCO-based second quantization stage further configured to filter the second digital signal with a second noise-shaping transfer function to generate a second noise-shaped digital output. A first digital filter is configured to filter the first noise-shaped digital output with an equivalent signal transfer function of the VCO-based second quantization stage to generate a first stage digital output, a second digital filter is configured to filter the second noise-shaped digital output with the first noise-shaping transfer function to generate a second stage digital output with second order noise-shaping characteristics, and a combination circuit is configured to combine the first stage digital output and the second stage digital output to generate a digital ADC output signal with second order noise shaping characteristics.

In another example, an analog-to-digital conversion (ADC) circuit includes a first quantization stage configured to receive an analog input signal and sample the analog input signal based on a first input clock signal to generate a first digital signal, the first quantization stage further configured to filter the first digital signal with a first noise-shaping transfer function to generate a first noise-shaped digital output and to generate a quantization error signal based on a comparison of the analog input signal and the first noise-shaped digital output. A voltage controlled oscillator (VCO)-based second quantization stage is configured to receive the quantization error signal and sample the quantization error signal based on a second input clock signal to generate a second digital signal, wherein the second input clock signal has a higher frequency than the first input clock frequency, the VCO-based second quantization stage being further configured to filter the second digital signal with a second noise-shaping transfer function to generate a second noise-shaped digital output. A digital up-sampler is configured to increase a sampling rate of the first noise-shaped digital output to generate an up-sampled digital output. A first digital filter is configured to filter the up-sampled digital output with an equivalent signal transfer function of the VCO-based second quantization stage to generate a first stage digital output, a second digital filter is configured to filter the second noise-shaped digital output with the first noise-shaping transfer function to generate a second stage digital output with second order noise-shaping characteristics, and a combination circuit is configured to combine the first stage digital output and the second stage digital output to generate a digital ADC output signal with second order noise shaping characteristics.

As a further example, an analog-to-digital conversion (ADC) method includes receiving an analog input signal at a first quantization stage, and sampling the analog input signal to generate a first digital signal. A quantization error signal is generated at the first quantization stage based on a comparison of the analog input signal and the first noise-shaped digital output. The first digital signal is filtered with a first noise-shaping transfer function to generate a first noise-shaped digital output. The quantization error signal is received at a voltage controlled oscillator (VCO)-based second quantization stage, and sampling the quantization error signal to generate a second digital signal, the second digital signal is filtered with a second noise-shaping transfer function to generate a second noise-shaped digital output. The first noise-shaped digital output is filtered with an equivalent signal transfer function of the VCO-based second quantization stage to generate a first stage digital output. The second noise-shaped digital output is filtered with the first noise-shaping transfer function to generate a second stage digital output with second order noise-shaping characteristics, and the first stage digital output and the second stage digital output are combined to generate a digital ADC output signal with second order noise shaping characteristics.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An analog-to-digital conversion (ADC) circuit, comprising:
   a first quantization stage configured to receive an analog input signal and sample the analog input signal to generate a first digital signal, the first quantization stage further configured to filter the first digital signal with a first noise-shaping transfer function to generate a first noise-shaped digital output and to generate a quantization error signal based on a comparison of the analog input signal and the first noise-shaped digital output;
   a voltage controlled oscillator (VCO)-based second quantization stage configured to receive the quantization error signal and sample the quantization error signal to generate a second digital signal, the VOC-based second quantization stage further configured to filter the second digital signal with a second noise-shaping transfer function to generate a second noise-shaped digital output;
   a first digital filter configured to filter the first noise-shaped digital output with an equivalent signal transfer function of the VCO-based second quantization stage to generate a first stage digital output;
   a second digital filter configured to filter the second noise-shaped digital output with the first noise-shaping transfer function to generate a second stage digital output with second order noise-shaping characteristics; and
   a combination circuit that combines the first stage digital output and the second stage digital output to generate a digital ADC output signal with second order noise shaping characteristics.

2. The ADC circuit of claim 1, wherein the VCO-based second quantization stage includes an open loop VCO-based quantizer.

3. The ADC circuit of claim 1, wherein the first quantization stage includes a successive approximation register (SAR) quantizer.

4. The ADC circuit of claim 3, wherein the quantization error signal for the first quantization stage is determined based on a residue voltage produced by the SAR quantizer during generation of the first noise-shaped digital output.

5. The ADC circuit of claim 1, wherein the first quantization stage is configured to filter the first digital signal using a loop filter with the first noise-shaping transfer function.

6. The ADC circuit of claim 1 wherein the VCO-based second quantization stage receives an inversion of the quantization error signal.

7. The ADC circuit of claim 6, wherein the combination circuit is an adder circuit.

8. The ADC circuit of claim 1, wherein the second noise-shaping transfer function approximates a first-order difference operation.

9. The ADC circuit of claim 1, wherein the first quantization stage is further configured to delay the quantization error signal by a clock cycle to generate a delayed quantization error signal and subtract the delayed quantization error signal from the analog input signal in a feedback loop.

10. An analog-to-digital conversion (ADC) circuit, comprising:
    a first quantization stage configured to receive an analog input signal and sample the analog input signal based on a first input clock signal to generate a first digital signal, the first quantization stage further configured to filter the first digital signal with a first noise-shaping transfer function to generate a first noise-shaped digital output and to generate a quantization error signal based on a comparison of the analog input signal and the first noise-shaped digital output;

a voltage controlled oscillator (VCO)-based second quantization stage configured to receive the quantization error signal and sample the quantization error signal based on a second input clock signal to generate a second digital signal, wherein the second input clock signal has a higher frequency than the first input clock frequency, the VCO-based second quantization stage further configured to filter the second digital signal with a second noise-shaping transfer function to generate a second noise-shaped digital output;

a digital up-sampler configured to increase a sampling rate of the first noise-shaped digital output to generate an up-sampled digital output;

a first digital filter configured to filter the up-sampled digital output with an equivalent signal transfer function of the VCO-based second quantization stage to generate a first stage digital output;

a second digital filter configured to filter the second noise-shaped digital output with the first noise-shaping transfer function to generate a second stage digital output with second order noise-shaping characteristics; and a combination circuit that combines the first stage digital output and the second stage digital output to generate a digital ADC output signal with second order noise shaping characteristics.

11. The ADC circuit of claim 10, wherein the digital up-sampler is configured to increase the sampling rate of the first noise-shaped digital output by an amount proportional to a ratio of the second input clock signal and the first input clock signal.

12. The ADC circuit of claim 10, wherein the VCO-based second quantization stage includes an open loop VCO-based quantizer.

13. The ADC circuit of claim 10, wherein the first quantization stage includes a successive approximation register (SAR) quantizer.

14. The ADC circuit of claim 10, wherein the VCO-based second quantization stage receives an inversion of the quantization error signal.

15. An analog-to-digital conversion (ADC) method, comprising:

receiving an analog input signal at a first quantization stage;

sampling the analog input signal at the first quantization stage to generate a first digital signal;

generating a quantization error signal at the first quantization stage based on a comparison of the analog input signal and the first noise-shaped digital output;

filtering the first digital signal with a first noise-shaping transfer function to generate a first noise-shaped digital output;

receiving the quantization error signal at a voltage controlled oscillator (VCO)-based second quantization stage, and sampling the quantization error signal to generate a second digital signal;

filtering the second digital signal with a second noise-shaping transfer function to generate a second noise-shaped digital output;

filtering the first noise-shaped digital output with an equivalent signal transfer function of the VCO-based second quantization stage to generate a first stage digital output;

filtering the second noise-shaped digital output with the first noise-shaping transfer function to generate a second stage digital output with second order noise-shaping characteristics; and combining the first stage digital output and the second stage digital output to generate a digital ADC output signal with second order noise shaping characteristics.

16. The ADC method of claim 15, wherein the first quantization stage includes a successive approximation register (SAR) quantizer.

17. The ADC method of claim 16, further comprising:
determining the quantization error signal for the first quantization stage based on a residue voltage produced by the SAR quantizer during generation of the first noise-shaped digital output.

18. The ADC method of claim 15, wherein the VCO-based second quantization stage receives an inversion of the quantization error signal.

19. The ADC method of claim 15, wherein the second noise-shaping transfer function approximates a first-order difference operation.

20. The ADC method of claim 15, further comprising:
delaying the quantization error signal by a clock cycle to generate a delayed quantization error signal, and
subtracting the delayed quantization error signal from the analog input signal in a feedback loop.

* * * * *